United States Patent
Yokoi

(10) Patent No.: US 6,911,725 B2
(45) Date of Patent: Jun. 28, 2005

(54) FILM SUBSTRATE, SEMICONDUCTOR DEVICE, METHOD OF MANUFACTURING FILM SUBSTRATE, METHOD OF MANUFACTURING SEMICONDUCTOR DEVICE AND METHOD OF MANUFACTURING CIRCUIT BOARD WITH SEMICONDUCTOR DEVICE

(75) Inventor: Tetsuya Yokoi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 10/254,779

(22) Filed: Sep. 26, 2002

(65) Prior Publication Data

US 2003/0057543 A1 Mar. 27, 2003

(30) Foreign Application Priority Data

Sep. 27, 2001 (JP) .................................... 2001-297041

(51) Int. Cl.[7] .............................................. H01L 23/48
(52) U.S. Cl. ........................ 257/693; 257/666; 257/667; 257/691
(58) Field of Search ................................ 257/693, 676, 257/606–670, 691, 692

(56) References Cited

U.S. PATENT DOCUMENTS 5,686,757 A * 11/1997 Urushima .................... 257/668
6,171,888 B1 * 1/2001 Lynch et al. ................. 438/123

FOREIGN PATENT DOCUMENTS

| JP | 3-84955 | 4/1991 |
| JP | 6-53288 | 2/1994 |
| JP | 11-121682 | 4/1999 |

* cited by examiner

Primary Examiner—Wael Fahmy
Assistant Examiner—Nathan W. Ha
(74) Attorney, Agent, or Firm—Finnegan, Henderson, Farabow, Garrett & Dunner, L.L.P.

(57) ABSTRACT

Disclosed is a film substrate comprising an insulative sheet including a first region to be separated, having a slit on an outer peripheral line of the first region, and on which a semiconductor device chip is to be mounted, and a conductive pattern formed on the insulative sheet, crossing the slit, and to be connected to an external terminal of the semiconductor device chip.

8 Claims, 11 Drawing Sheets

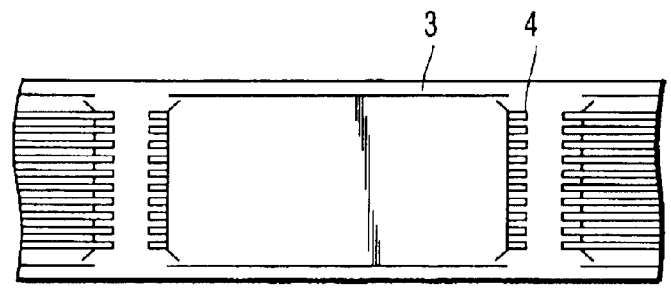
F I G. 12
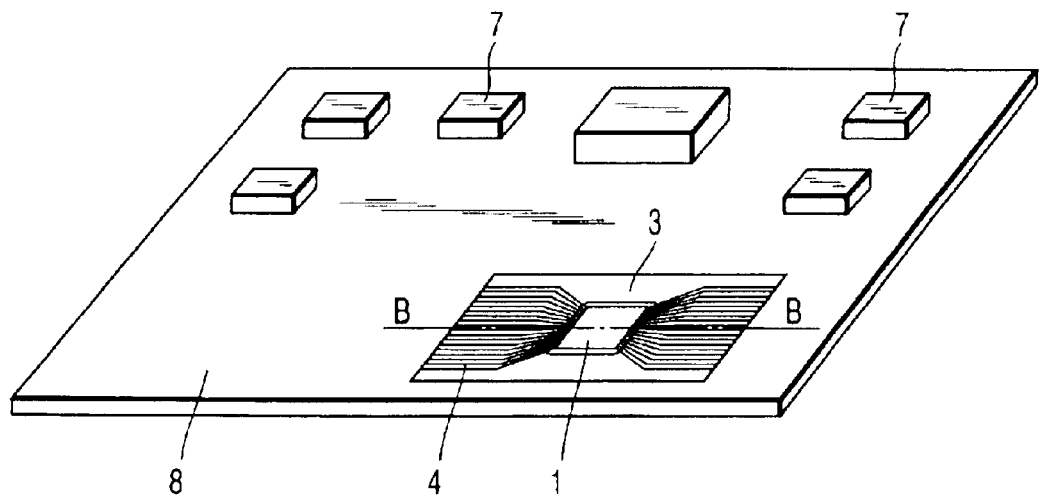
F I G. 13A
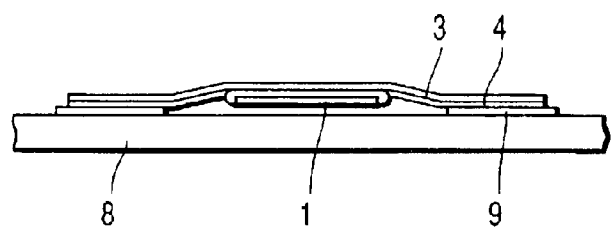
F I G. 13B

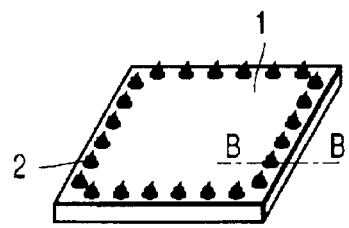 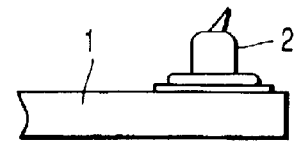
FIG. 18A PRIOR ART
FIG. 18B PRIOR ART
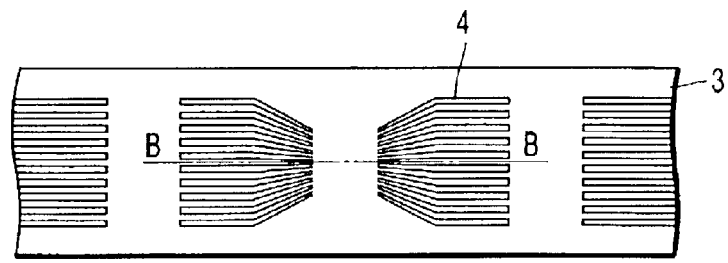
FIG. 19A PRIOR ART
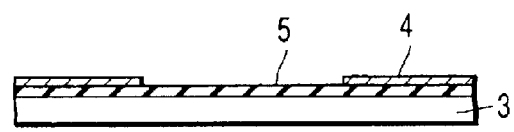
FIG. 19B PRIOR ART
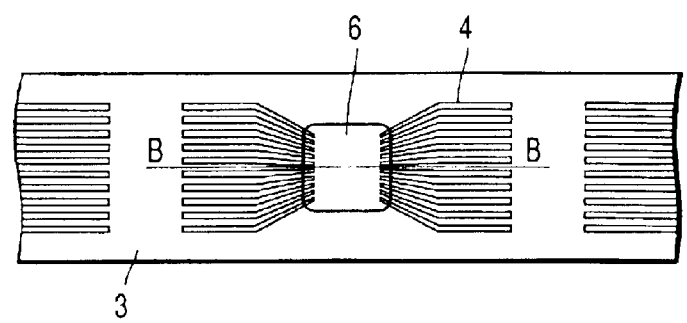
FIG. 20A PRIOR ART
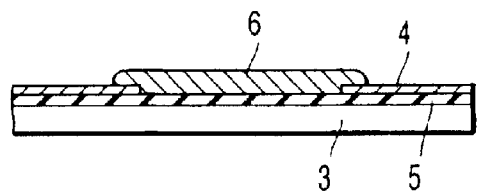
FIG. 20B PRIOR ART

FILM SUBSTRATE, SEMICONDUCTOR DEVICE, METHOD OF MANUFACTURING FILM SUBSTRATE, METHOD OF MANUFACTURING SEMICONDUCTOR DEVICE AND METHOD OF MANUFACTURING CIRCUIT BOARD WITH SEMICONDUCTOR DEVICE

CROSS-REFERENCE TO RELATED APPLICATIONS

This application is based upon and claims the benefit of priority from the prior Japanese Patent Application No. 2001-297041, filed on Sep. 27, 2001, the entire contents of which are incorporated herein by reference.

BACKGROUND OF THE INVENTION

1. Field of the Invention

The present invention relates to a film substrate on which a semiconductor device chip is to be mounted, to a semiconductor device, to a method of manufacturing the film substrate, to a method of manufacturing the semiconductor device, and to a method of manufacturing a circuit board with the semiconductor device.

2. Description of the Related Art

A conventional method of mounting a semiconductor device chip on an insulative film on which a conductive pattern has been formed will be described below with reference to FIG. 18A and FIG. 18B to FIG. 22A and FIG. 22B.

FIG. 18A is a perspective view sowing an external appearance of a semiconductor device chip 1 (semiconductor integrated circuit device chip, etc.), and FIG. 18B is a cross-sectional view taken along a line B—B of FIG. 18A. The surface of the semiconductor device chip 1 is formed with a plurality of stud bumps 2 as an external terminal.

FIG. 19A is a plan view showing a tape-like insulative film 3 on which a conductive pattern (wiring pattern) 4 has been formed, and FIG. 19B is a cross-sectional view taken along a line B—B of FIG. 19A. The structure shown in FIG. 19A and FIG. 19B is obtained in the following manner. That is, a conductive metal foil (e.g., copper or aluminum foil having a thickness of about 35 $\mu$m) is stuck on the insulative film 3 (having a thickness of about 25 to 75 $\mu$m) via a bonding (adhesive) agent 5. Thereafter, the conductive metal foil is patterned by lithography and etching.

As illustrated in FIG. 20A and FIG. 20B, an anisotropic conductive resin 6 is stuck to a chip mounting region on the surface of the insulative film 3 with the conductive pattern 4 thus obtained. Further, as shown in FIG. 21A and FIG. 21B, the semiconductor device chip 1 is mounted on the anisotropic conductive resin 6 by flip chip method. In the above manner, a tape-like film substrate is obtained.

Thereafter, as illustrated in FIG. 22A, a film having a predetermined shape is separated from the tape-like film substrate by a press machine. By doing so, a film substrate piece shown in FIG. 22B is obtained.

The film substrate piece thus obtained is mounted on circuit boards such as PCB (Printed Circuit Board) and FPC (Flexile Printed Circuit board) in the following manner.

First, as illustrated in FIG. 23A and FIG. 23B, a conductive bonding agent 10 is stuck onto a circuit board 8 on which passive elements 7 and connecting terminals 9 are formed. In this case, anisotropic conductive resin may be used as the conductive bonding agent 10.

As shown in FIG. 24, the film substrate piece obtained in the step of FIG. 22A and FIG. 22B is placed on the circuit board 8 using an adsorption apparatus 11. Then, connection is made between the conductive pattern 4 formed on the film substrate piece and the connecting terminal 9 formed on the circuit board 8 by the conductive bonding agent. When making the above connection, thermocompression bonding (200° C., about 20 seconds) is carried out by a thermocompression bonding apparatus 12.

However, the above conventional method has the following problems because the film substrate piece is separated from the tape-like film substrate, and thereafter, the separated film substrate piece is mounted on the circuit board.

More specifically, the film substrate piece must be individually handled; for this reason, handling of the film substrate piece is difficult. As a result, it is difficult to achieve the improvement of productivity by automation. Further, if the size of the film substrate piece is made small, it is impossible to use the adsorption apparatus 11 and the thermocompression bonding apparatus 12 together. As a result, as seen from FIG. 25A and FIG. 25B, two steps must be carried out; for this reason, this is a factor of increasing the number of steps. Further, as shown in FIG. 26, the conductive bonding agent 10 projects from the peripheral edge portion of the film substrate piece. As a result, for example, there is a possibility that the bonding agent adheres to the thermocompression bonding apparatus 12. In order to prevent the above problem, the film substrate piece must be made large; for this reason, this does not meet the needs of miniaturization.

As described above, according to the conventional technique, the film substrate piece is separated from the tape-like film substrate, and thereafter, the separated film substrate piece is mounted on the circuit board. For this reason, there are various problems that handling is troublesome, miniaturization is difficult, and productivity is worse.

On the other hand, the following technique has been disclosed in JPN. PAT. APPLN. KOKAI Publications No. 3-84955 and No. 6-53288. According to the technique, slit is previously formed in the tape-like film substrate on which semiconductor device chips are mounted. The inner region of the slit is provided with a semiconductor device chip and a conductive pattern connected thereto. The slit is previously formed, and thereby, the film substrate piece is easy to separate from the tape-like film substrate.

However, according to the method disclosed in the above conventional technique, the inner and outer regions of the slit are merely connected by a portion between adjacent slits. In other words, before separation, the inner region of the slit is held only by the portion between adjacent slits. Therefore, the holding strength of the inner region of the slit is low; for this reason, there is a problem that handling of the tape-like film substrate is difficult.

BRIEF SUMMARY OF THE INVENTION

According to a first aspect of the present invention, there is provided a film substrate comprising: an insulative sheet including a first region to be separated, having a slit on an outer peripheral line of the first region, and on which a semiconductor device chip is to be mounted; and a conductive pattern formed on the insulative sheet, crossing the slit, and to be connected to an external terminal of the semiconductor device chip.

According to a second aspect of the present invention, there is provided a semiconductor device comprising: an insulative sheet including a first region to be separated, and having a slit on an outer peripheral line of the first region; a conductive pattern formed on the insulative sheet, and crossing the slit; and a semiconductor device chip mounted on the insulative sheet, and having an external terminal electrically connected to the conductive pattern.

According to a third aspect of the present invention, there is provided a method of manufacturing a film substrate, comprising: preparing an insulative sheet including a first region to be separated, and on which a semiconductor device chip is to be mounted; forming a slit on an outer peripheral line of the first region of the insulative sheet; and forming a conductive pattern crossing the slit and to be connected to an external terminal of the semiconductor device chip, on the insulative sheet.

According to a fourth aspect of the present invention, there is provided a method of manufacturing a semiconductor device, comprising: preparing an insulative sheet including a first region to be separated; forming a slit on an outer peripheral line of the first region of the insulative sheet; forming a conductive pattern crossing the slit, on the insulative sheet; and mounting a semiconductor device chip on the insulative sheet to electrically connect an external terminal of the semiconductor device chip to the conductive pattern.

According to a fifth aspect of the present invention, there is provided a method of manufacturing a circuit board with a semiconductor device, comprising: preparing an insulative sheet including a first region to be separated and a second region on the outer side of the first region; forming a slit on an outer peripheral line of the first region of the insulative sheet; forming a conductive pattern crossing the slit, on the insulative sheet; mounting a semiconductor device chip on the insulative sheet to electrically connect an external terminal of the semiconductor device chip to the conductive pattern; bonding at least a part of the first region of the insulative sheet on which the semiconductor device chip is mounted to a circuit board; and separating the second region from the first region to leave the first region on the circuit board.

BRIEF DESCRIPTION OF THE SEVERAL VIEWS OF THE DRAWING

FIG. 12 is a view to explain a manufacturing method according to an embodiment of the present invention;

FIG. 13A and FIG. 13B are views to explain a manufacturing method according to an embodiment of the present invention;

FIG. 18A and FIG. 18B are views to explain a manufacturing method according to a conventional technique;

FIG. 19A and FIG. 19B are views to explain a manufacturing method according to a conventional technique;

FIG. 20A and FIG. 20B are views to explain a manufacturing method according to a conventional technique;

DETAILED DESCRIPTION OF THE INVENTION

The embodiment of the present invention will be described below with reference to the accompanying drawings.

First, the manufacturing method according to the embodiment will be described with reference to FIG. 1A and FIG. 1B to FIG. 13A and FIG. 13B.

Figure 1A:
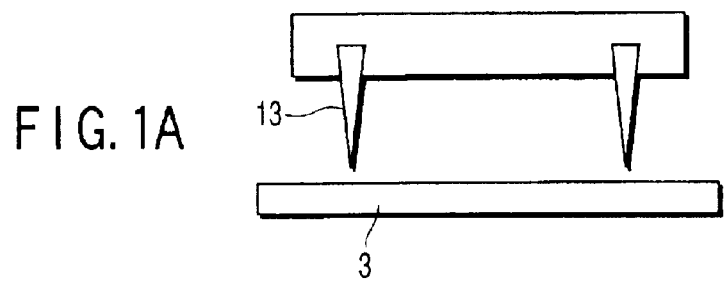
FIG. 1A and FIG. 1B are views to explain a manufacturing method according to an embodiment of the present invention.
Figure 1B:
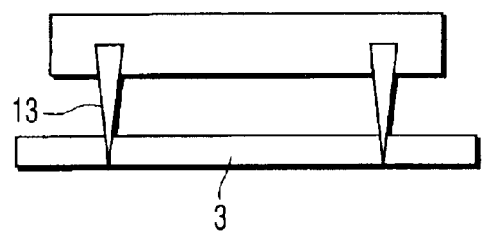

As illustrated in FIG. 1A and FIG. 1B, a slit is formed in a tape-like insulative film (which corresponds to insulative sheet) 3 such as polyimide and PET (polyester terephthalate) using a metal blade (e.g., Thomson blade) 13 so as to penetrate through the insulative film 3.

Figure 2A:
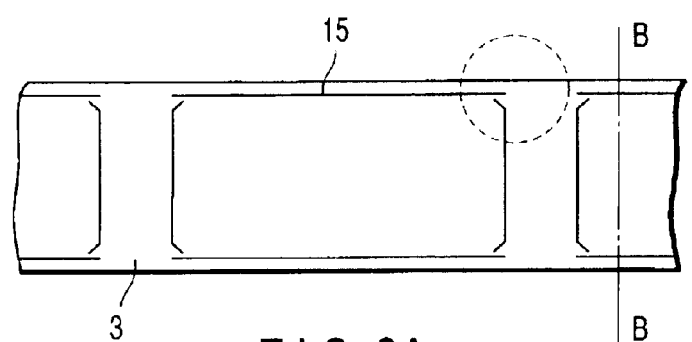
FIG. 2A to FIG. 2C are views to explain a manufacturing method according to an embodiment of the present invention.
Figure 2B:
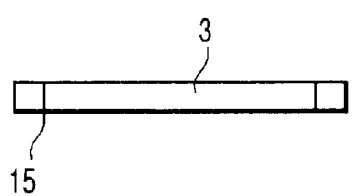
Figure 2C:
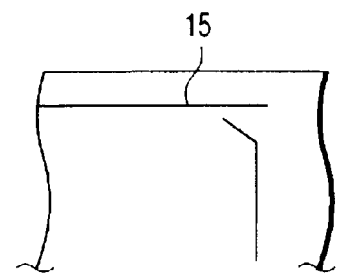

FIG. 2A is a plan view showing the insulative film 3 with a slit 15, FIG. 2B is a cross-sectional view taken along a line B—B of FIG. 2A, and FIG. 2C is an enlarged view showing a circle shown by the broken line of FIG. 2A. As seen from FIG. 2A, the slit 15 is formed partially along the outer peripheral line (outline) of a separating region (finally necessary region), which will be separated. That is, the slit 15 is not formed over the entire outer peripheral line of the separating region, but there exists a portion where no slit 15 is formed in the portion corresponding to the outer peripheral line. The slit 15 serves to separate the inner portion of the slit 15 in the later step. In order to readily separate the inner portion of the slit 15 in a separation step and to prevent the inner portion from coming off before the separation step, it is preferable that a length of the slit 15 is set in the following range. More specifically, the length of the slit 15 is set to 70% or more and 100% or less (preferably, 99% or less) with respect to the entire length of the outer peripheral line. In FIG. 2A, although there are four portions where no slit is formed, the portion is formed one or more, preferably two or more.

Figure 3A:
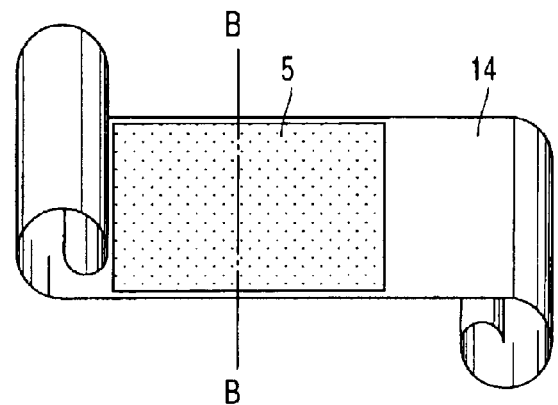
FIG. 3A and FIG. 3B are views to explain a manufacturing method according to an embodiment of the present invention.
Figure 3B:
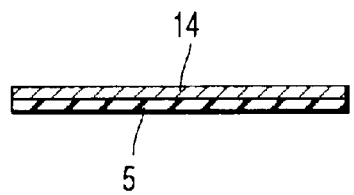

Meanwhile, as illustrated in FIG. 3A and FIG. 3B, a conductive metal foil 14 is prepared for forming a conductive pattern (wiring pattern) on the insulative film 3, and then, a bonding agent 5 is applied on the metal foil 14. For example, copper or aluminum foil may be used as the metal foil 15. Further, #7100 of Toray manufacture or X of Tomoegawa Seishi manufacture may be used as the bonding agent 5.

Figure 4A:
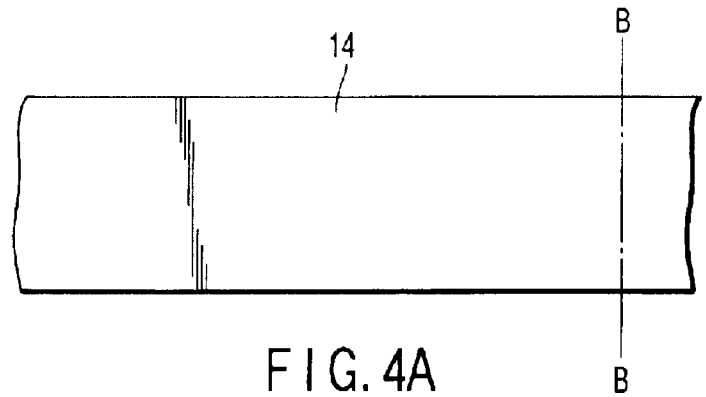
FIG. 4A and FIG. 4B are views to explain a manufacturing method according to an embodiment of the present invention.
Figure 4B:
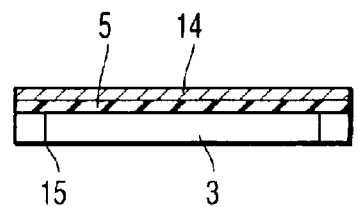

Thereafter, as shown in FIG. 4A and FIG. 4B, the insulative film 3 having the slit 15 and the metal foil 14 are stuck together via the bonding agent 5.

Figure 5A:
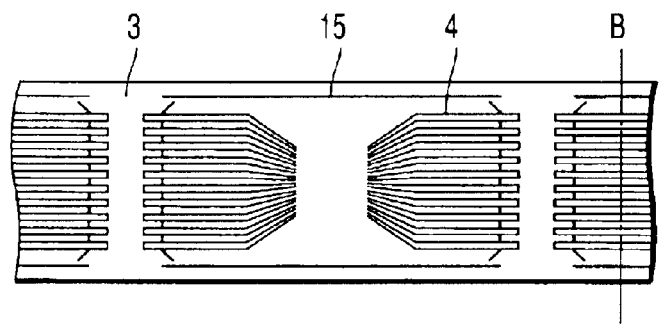
FIG. 5A and FIG. 5B are views to explain a manufacturing method according to an embodiment of the present invention.
Figure 5B:
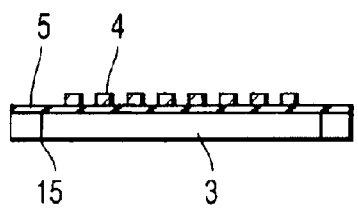

As illustrated in FIG. 5A and FIG. 5B, the metal foil 14 is patterned by lithography and etching so that a conductive pattern (wiring pattern) 4 can be formed. If copper or aluminum foil is used as the metal foil 14, etching may be carried out using chemical agent such as ferric chloride. In this case, the conductive pattern 4 is formed so as to cross the slit 15. In this manner, it is possible to obtain a tape-shape film substrate in which the conductive pattern 4 is formed on the insulative film 3 having the slit 15.

Figure 6A:
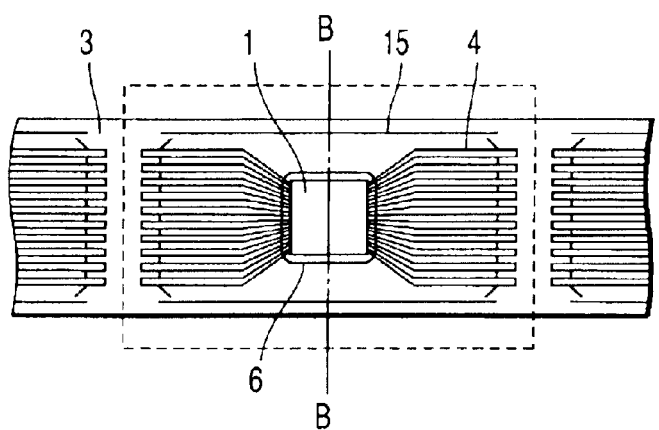
FIG. 6A and FIG. 6B are views to explain a manufacturing method according to an embodiment of the present invention.
Figure 6B:
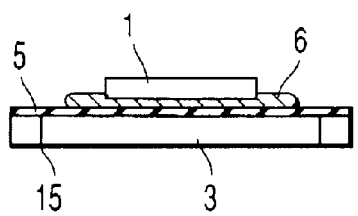

As seen from FIG. 6A and FIG. 6B, an anisotropic conductive resin 6 having adhesiveness is stuck onto a chip mounting region on the surface of the insulative film 3, which is formed with the conductive pattern 4. By flip chip method, a semiconductor device chip 1 is mounted on the anisotropic conductive resin 6. In this case, the semiconductor device chip 1 is the same as described in the conventional technique of FIG. 18A and FIG. 18B, and is formed with a plurality of stud bumps as an external terminal at the back side. Each stud bump is electrically connected to the corresponding conductive pattern 4 via the anisotropic conductive resin 6.

In the above manner, it is possible to obtain a tape-like film substrate on which the semiconductor device chip 1 has been mounted. Such a tape-like film substrate can be continuously manufactured in a reel or roll state, and the unit structure (surrounded by the broken line) shown in FIG. 6A is continuously formed.

Next, by using the tape-like film substrate thus obtained, a film substrate is mounted on a circuit board such as PCB and FPC in the following manner.

Figure 7B:
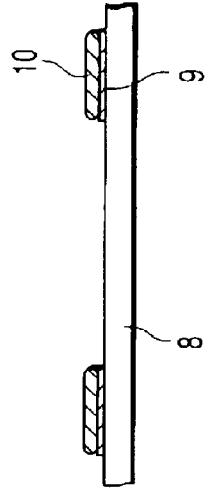
FIG. 7A and FIG. 7B are views to explain a manufacturing method according to an embodiment of the present invention.
Figure 7A:
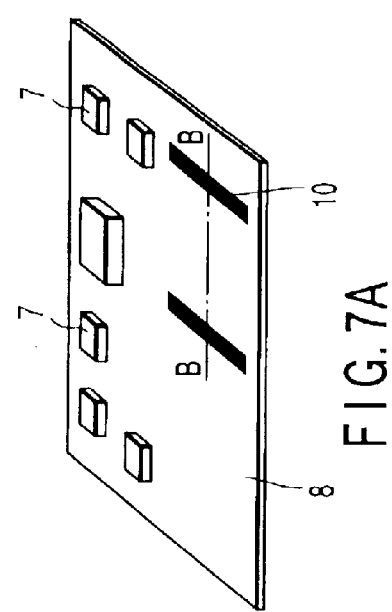

As seen from FIG. 7A and FIG. 7B, a circuit board 8 on which a passive element 7 and a connecting terminal 9 are formed is prepared, and a conductive bonding agent 10 is stuck on a region where the connecting terminal 9 is formed. An anisotropic conductive resin (e.g., FC-262B of Hitachi Kasei manufacture) may be used as the conductive bonding agent 10.

Figure 8:
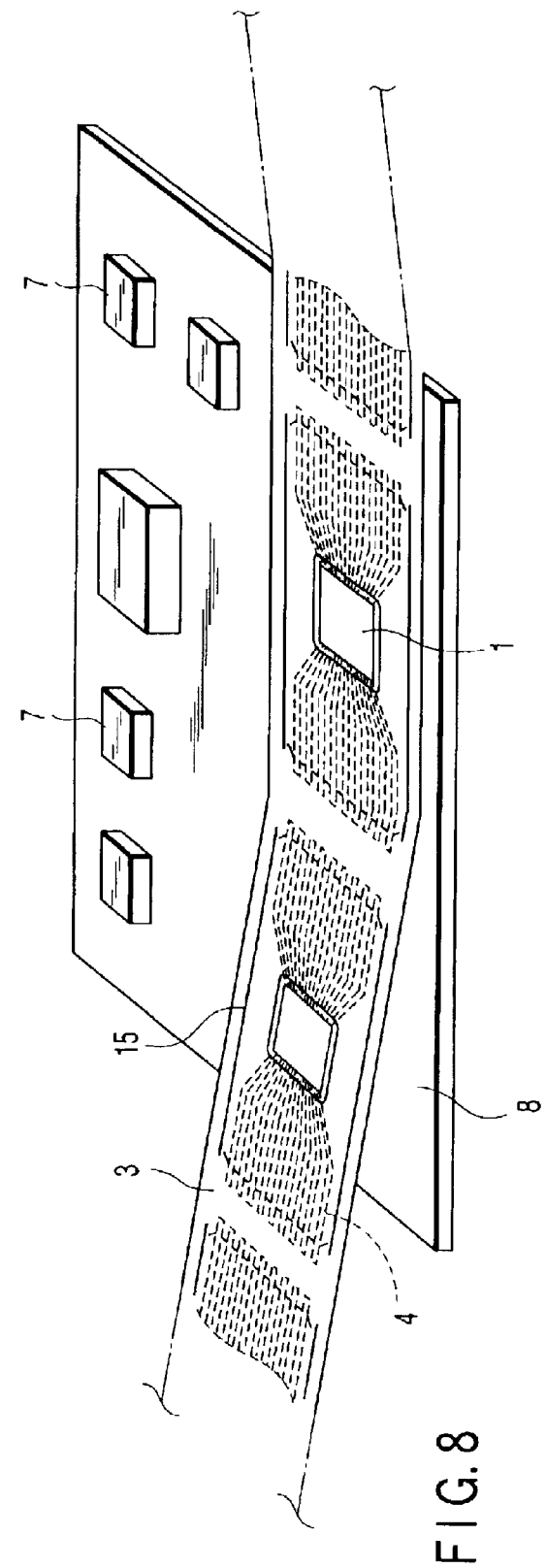
FIG. 8 is a view to explain a manufacturing method according to an embodiment of the present invention.

As illustrated in FIG. 8, the tape-like film substrate on which the semiconductor device chip 1 is mounted shown in FIG. 6A and FIG. 6B is placed on the circuit board 8 shown in FIG. 7A and FIG. 7B. The conductive pattern 4 formed on the tape-like film substrate is connected with the connecting terminal 9 formed on the circuit board 8 via the conductive bonding agent 10.

Figure 9:
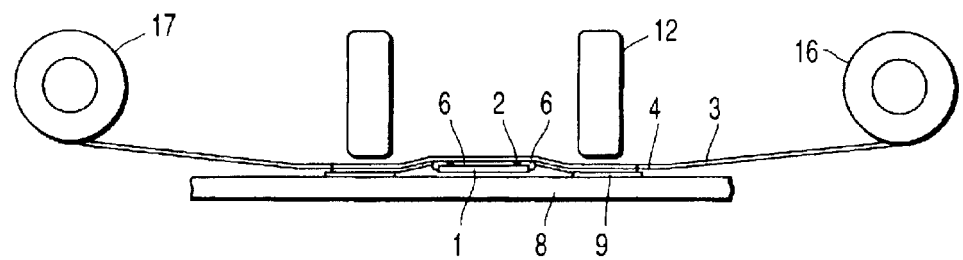
FIG. 9 is a view to explain a manufacturing method according to an embodiment of the present invention.
Figure 10:
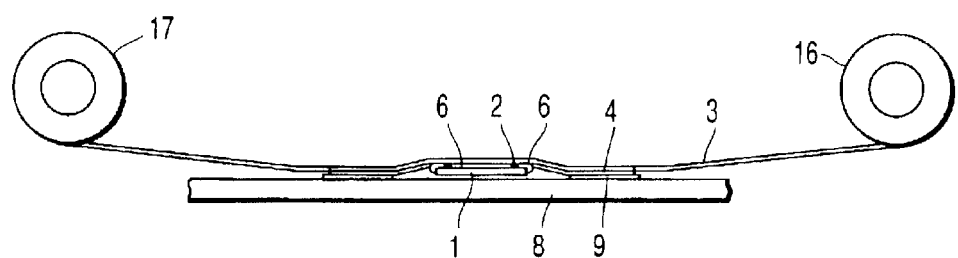
FIG. 10 is a view to explain a manufacturing method according to an embodiment of the present invention.

More specifically, as shown in FIG. 9, alignment of the tape-like film substrate on which the semi-conductor device chip 1 is mounted and held by rollers 16 and 17 with the circuit board 8 is carried out, thereafter, connection is made between the tape-like film substrate and the circuit board 8. When making the above connection, thermocompression bonding (200° C., about 20 seconds) is carried out by a thermocompression bonding apparatus 12. By doing so, each stud bump 2 (external terminal) provided on the semiconductor device chip 1 is electrically connected to the corresponding connecting terminal 9 formed on the circuit board via the corresponding conductive pattern 4. In FIG. 9, for convenience of paper, the bonding agent 5 and the conductive bonding agent 10 are not illustrated there; however, in fact, they are formed as seen from FIGS. 5A and 5B to FIG. 7A to FIG. 7B (they are not illustrated in the following figures). FIG. 10 shows a state that the tape-like film substrate on which the semiconductor device chip 1 is mounted and the circuit board 8 are bonded together in the above manner.

Figure 11:
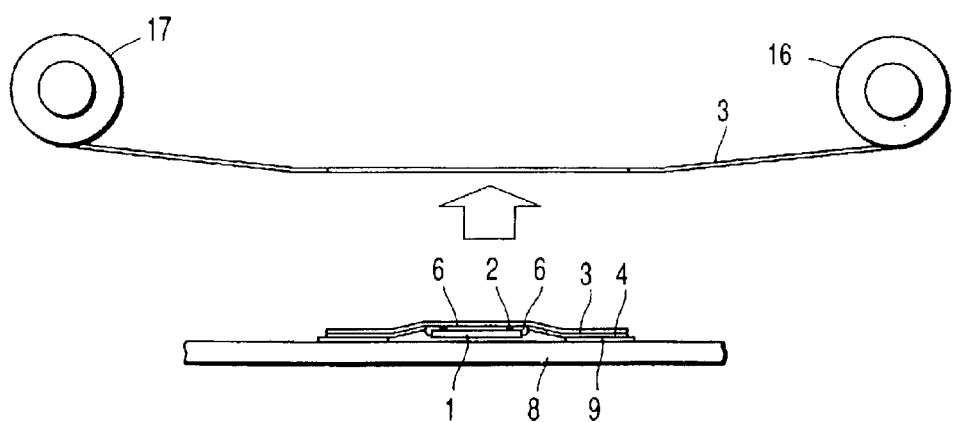
FIG. 11 is a view to explain a manufacturing method according to an embodiment of the present invention.
Figure 14A:
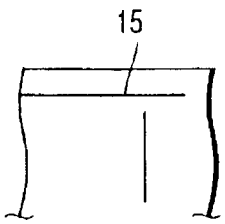
FIG. 14A to FIG. 14D are views to explain a modification example according to an embodiment of the present invention.
Figure 14B:
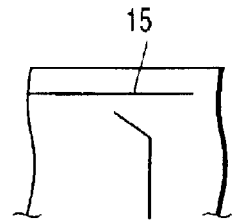
Figure 14C:
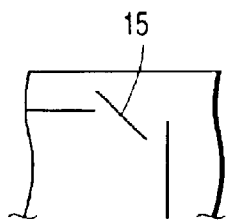
Figure 14D:
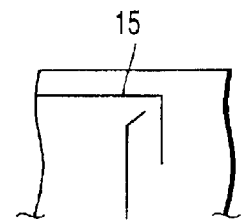

As shown in FIG. 11, the rollers 16 and 17 are moved upwardly so that the tape-like film substrate can be left up. In this case, the tape-like film substrate is formed with the slit 15; therefore, only inner portion of the slit is separated as a film substrate piece, and remains on the circuit board 8. Other portions of the tape-like film substrate are cut off in a shape shown in FIG. 12.

In the above manner, it is possible to obtain a circuit board on which the film substrate piece with the semiconductor device chip 1 is mounted, as illustrated in FIG. 13A and FIG. 13B.

Thereafter, the tape-like film substrate is wound by one unit structure shown in FIG. 6A by one roller (e.g., roller 17); in other words, after the step of FIG. 11, the tape-like film substrate is moved by one unit structure. Thereafter, the same step as above is carried out, and thereby, a film substrate piece is mounted on other circuit boards. Further, the same step is repeated, and thereby, it is possible to successively mount each film substrate piece on each circuit board.

Figure 25A:
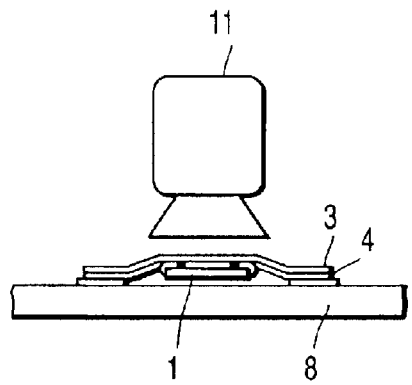
FIG. 25A and FIG. 25B are views to explain the problems of the conventional technique.
Figure 25B:
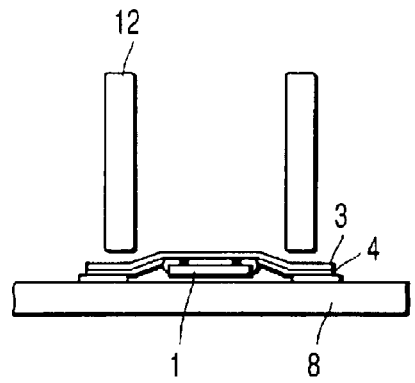
Figure 26:
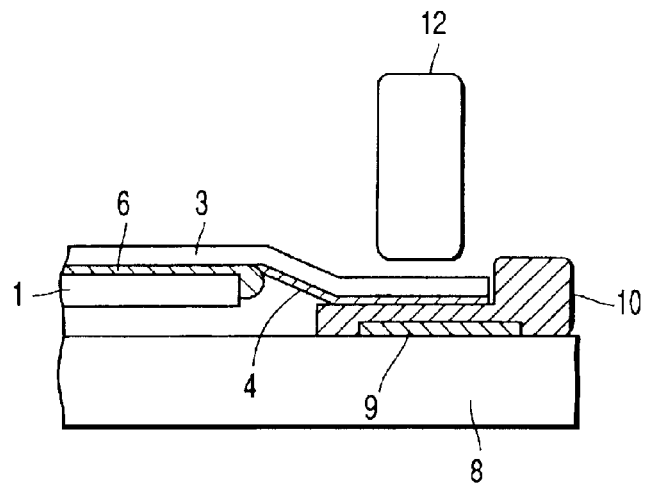
FIG. 26 is a view to explain the problems of the conventional technique.

As described above, according to the present embodiment, since the insulative film 3 is previously formed with the slit 15, the film substrate piece is readily separated in a state that the tape-like film substrate is connected to the circuit board 8. Therefore, it is possible to handle the tape-like film substrate without separating it into individual film substrate pieces, and thus, to achieve the improvement of productivity by automation. Further, since it is possible to solve the following problems described in the conventional technique, the film substrate piece can be made small. The above problems, that is, one is the problem that the adsorption apparatus and the thermocompression bonding apparatus are not used together (see FIG. 25). Another is the problem that the conductive bonding agent projects from the peripheral edge portion of the film substrate piece (see FIG. 26). Further, since the conductive pattern 4 is formed so as to cross the slit 15 (see FIG. 5A and FIG. 5B, FIG. 6A and FIG. 6B), the film substrate piece is securely held until it is finally separated. Therefore, handling of the tape-like film substrate is easy.

In the present embodiment, the following various modification examples may be carried out.

FIG. 14A to FIG. 14D show various modification examples relevant to the shape of the slit 15. Even If the slit shapes shown in the modification examples are employed, the same effect as above can be obtained.

Figure 15A:
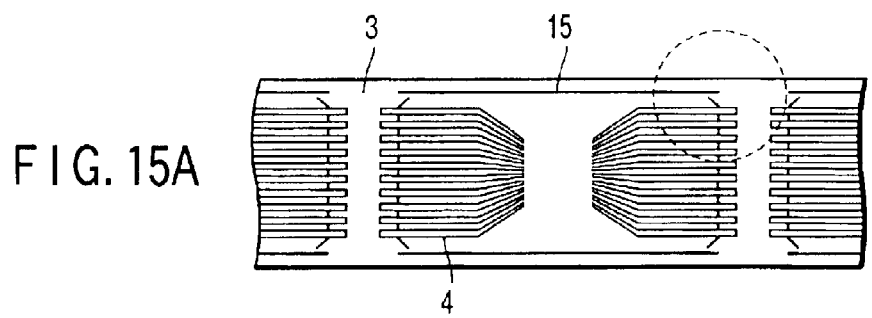
FIG. 15A and FIG. 15B are views to explain another modification example according to an embodiment of the present invention.
Figure 15B:
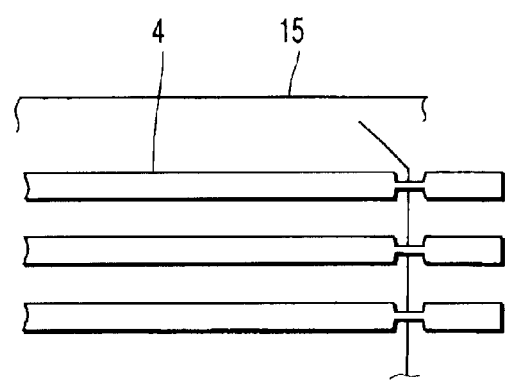

FIG. 15A and FIG. 15B show a modification example relevant to the shape of the conductive pattern 4. In the modification example, as shown in FIG. 15B (enlarged view of the circuit shown by the broken line in FIG. 15A), the line width of the conductive pattern 4 becomes narrow at the portion crossing the slit 15. The above structure is employed, and thereby, it is possible to securely and readily separate the film substrate piece.

Figure 16A:
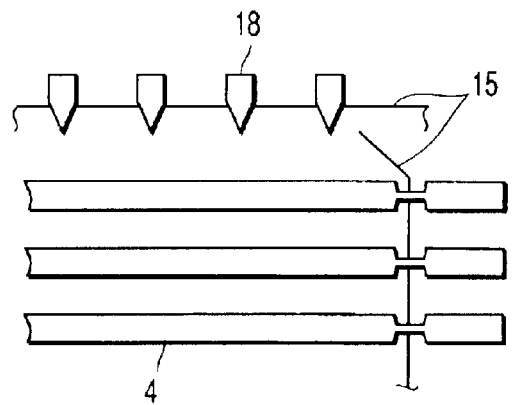
FIG. 16A and FIG. 16B are views to explain another modification example according to an embodiment of the present invention.
Figure 16B:
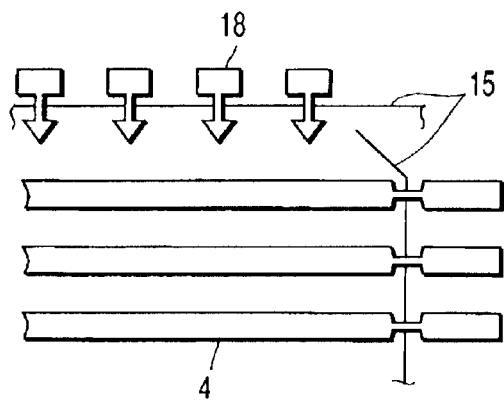

FIG. 16A and FIG. 16B are views showing a state that an additional conductive pattern 18 independent from the conductive pattern 4 is formed on the insulative film. The conductive pattern 18 is also formed so as to cross the slit 15. The conductive pattern 18 is simultaneously patterned in the patterning step of the conductive pattern 4. However, in this case, the conductive pattern 18 is electrically isolated from the external terminal (stud bump) of the semiconductor device chip. As described above, the additional conductive pattern 18 is formed, and thereby, the film substrate piece can be securely held until it is finally separated.

Figure 17A:
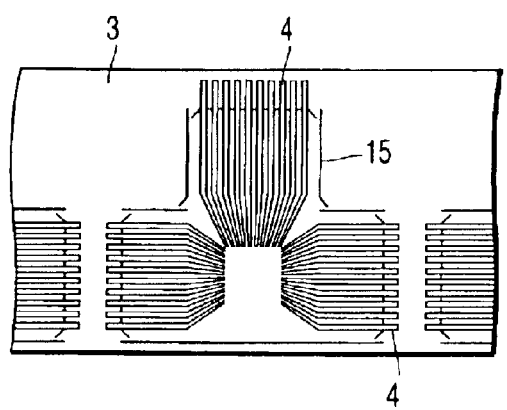
FIG. 17A and FIG. 17B are views to explain another modification example according to an embodiment of the present invention.
Figure 17B:
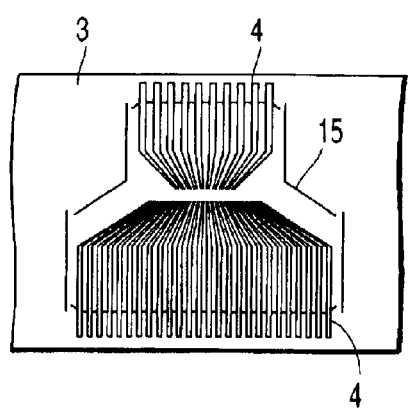
Figure 21A:
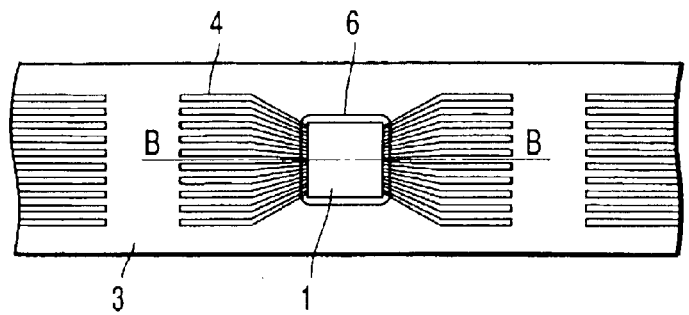
FIG. 21A and FIG. 21B are views to explain a manufacturing method according to a conventional technique.
Figure 21B:
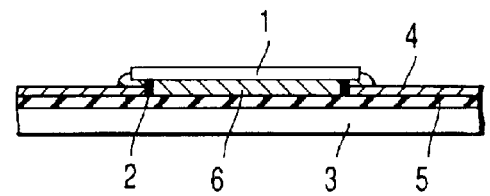
Figure 22A:
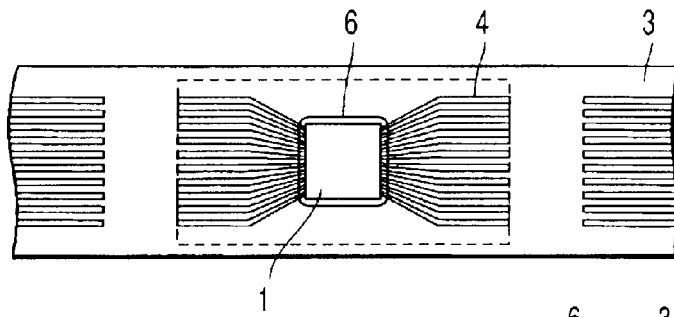
FIG. 22A and FIG. 22B are views to explain a manufacturing method according to a conventional technique.
Figure 22B:
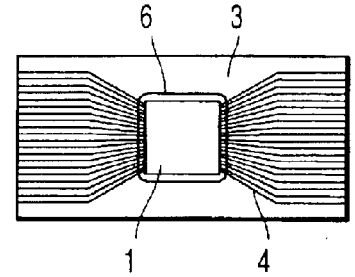
Figure 23A:
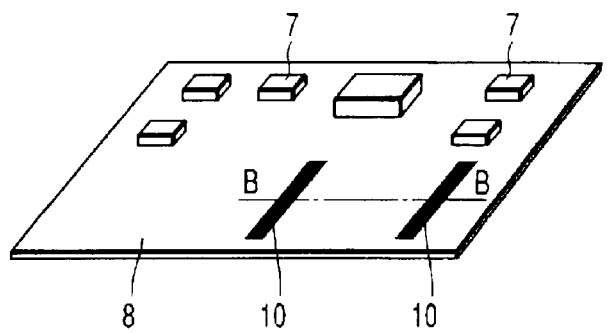
FIG. 23A and FIG. 23B are views to explain a manufacturing method according to a conventional technique.
Figure 23B:
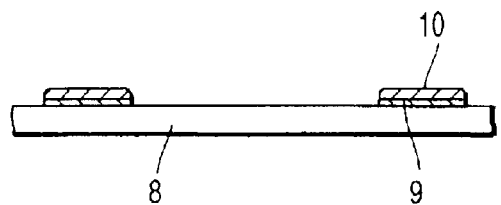
Figure 24:
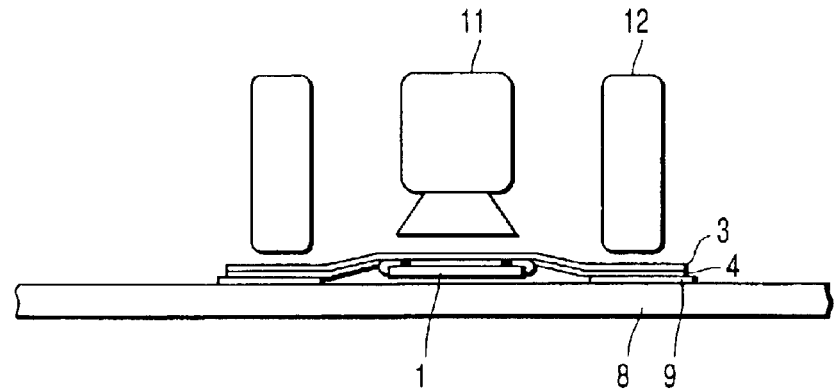
FIG. 24 is a view to explain a manufacturing method according to a conventional technique.

FIG. 17A and FIG. 17B show modification examples of the conductive pattern 4 and the slit 15 corresponding to there. FIG. 17A shows the example in which the conductive pattern 4 is arranged in three directions. FIG. 17B shows the example in which the lower-side conductive pattern 4 has more patterns and a higher density than the upper-side conductive pattern 4. In either example, the pattern of the slit 15 becomes complicate resulting from the arrangement shape of the conductive pattern 4 as compared with the above embodiment (see FIG. 5a and FIG. 5B). However, in such a case, the same effect as the above embodiment can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film substrate comprising:
    an insulative sheet including a first region to be separated, having a line slit on an outer peripheral line of the first region, and on which a semiconductor device chip is to be mounted; and
    a conductive pattern formed on the insulative sheet, crossing the line slit, and to be connected to an external terminal of the semiconductor device chip, wherein the line slit has a width smaller than that of the conductive pattern.

2. The film substrate according to claim 1, wherein the line slit has a length greater than 70% and smaller than 100% of a length of the outer peripheral line.

3. The film substrate according to claim 1, wherein the conductive pattern includes a first portion, a second portion, and a third portion positioned between the first portion and the second portion and crossing the line slit, the third portion having a width smaller than those of the first portion and the second portion.

4. The film substrate according to claim 1, further comprising:
    an additional conductive pattern formed on the insulative sheet, crossing the line slit on the outer peripheral line, and not to be connected to an external terminal of the semiconductor device chip.

5. A semiconductor device comprising:
    an insulative sheet including a first region to be separated, and having a line slit on an outer peripheral line of the first region;
    a conductive pattern formed on the insulative sheet, and crossing the line slit; and
    a semiconductor device chip mounted on the insulative sheet, and having an external terminal electrically connected to the conductive pattern, wherein the line slit has a width smaller than that of the conductive pattern.

6. The semiconductor device according to claim 5, wherein the line slit has a length greater than 70% and smaller than 100% of a length of the outer peripheral line.

7. The semiconductor device according to claim 5, wherein the conductive pattern includes a first portion, a second portion, and a third portion positioned between the first portion and the second portion and crossing the line slit, the third portion having a width smaller than those of the first portion and the second portion.

8. The semiconductor device according to claim 5, further comprising:
    an additional conductive pattern formed on the insulative sheet, crossing the line slit on the outer peripheral line, and not connected to an external terminal of the semiconductor device chip.

* * * * *